(12) United States Patent
Frohnhöfer et al.

(10) Patent No.: US 7,956,626 B2
(45) Date of Patent: Jun. 7, 2011

(54) CIRCUIT ARRANGEMENT WITH SWITCHABLE FUNCTIONALITY AND ELECTRONIC COMPONENT

(75) Inventors: Thomas Frohnhöfer, Teublitz (DE); Ralf Föster, Regensburg (DE); Dieter Saβ, Shanghai (CN)

(73) Assignee: Continental Automotive GmbH, Hannover (DE)

( * ) Notice: Subject to any disclaimer, the term of this patent is extended or adjusted under 35 U.S.C. 154(b) by 176 days.

(21) Appl. No.: 12/282,939

(22) PCT Filed: Mar. 8, 2007

(86) PCT No.: PCT/EP2007/052190
§ 371 (c)(1), (2), (4) Date: Nov. 6, 2008

(87) PCT Pub. No.: WO2007/104701
PCT Pub. Date: Sep. 20, 2007

(65) Prior Publication Data
US 2009/0066355 A1    Mar. 12, 2009

(30) Foreign Application Priority Data

Mar. 14, 2006  (DE) .......................... 10 2006 011 726

(51) Int. Cl.
*G01R 31/26* (2006.01)

(52) U.S. Cl. ................................................ 324/750.15
(58) Field of Classification Search ........................ None
See application file for complete search history.

(56) References Cited

U.S. PATENT DOCUMENTS

| | | |
|---|---|---|
| 4,990,996 A | 2/1991 | Kumar et al. |
| 5,896,057 A | 4/1999 | Chicca et al. |
| 6,525,560 B1 | 2/2003 | Trimberger et al. |

FOREIGN PATENT DOCUMENTS

| | | |
|---|---|---|
| DE | 19961148 C1 | 9/2001 |
| EP | 0810444 A1 | 12/1997 |
| EP | 1454807 A1 | 9/2004 |

*Primary Examiner* — Jermele M Hollington
(74) *Attorney, Agent, or Firm* — Laurence A. Greenberg; Werner H. Stemer; Ralph E. Locher

(57) ABSTRACT

A circuit with switchable functionality has a first integrated circuit, which has, in a first operating mode, full functionality and which has, in at least one other operating mode, a functionality which is reduced in comparison with the full functionality. The circuit further has an output terminal to which a coupling element can be coupled, an identification device which identifies whether a first supply potential has been applied to the output terminal via the coupling element and in this case produces a status signal with a first value and otherwise produces a status signal with a second value, a setting device, which sets the full or reduced functionality as a function of the value of the status signal in the first integrated circuit. The invention also relates to an electronic component having such a circuit arrangement.

14 Claims, 2 Drawing Sheets

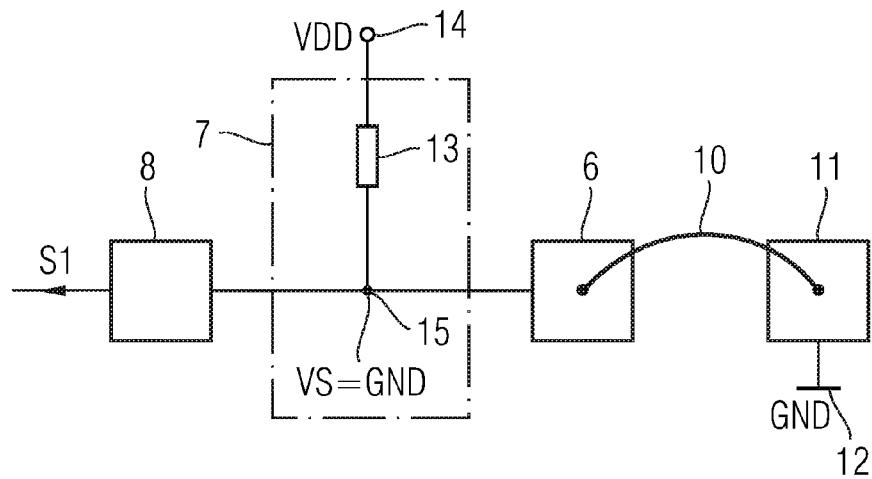
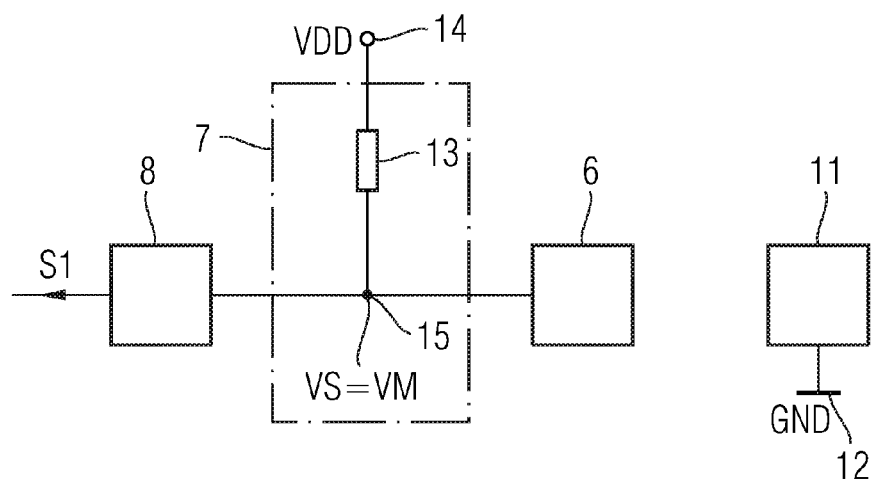
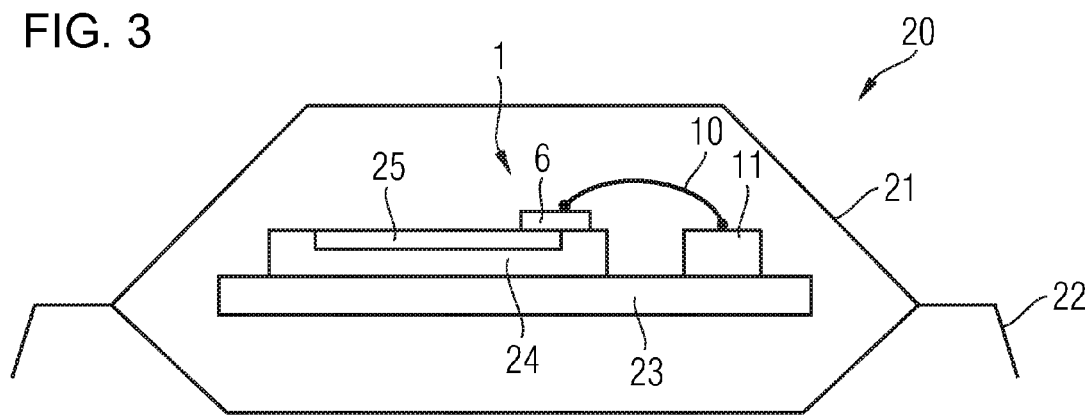

CIRCUIT ARRANGEMENT WITH SWITCHABLE FUNCTIONALITY AND ELECTRONIC COMPONENT

This application is a §371 of PCT/EP07/52190, filed Mar. 8, 2007

BACKGROUND OF THE INVENTION

Field of the Invention

The invention relates to a circuit arrangement with switchable functionality as well as an electronic component with such a circuit arrangement.

In control devices for modern motor vehicles, a plurality of electrical and electronic circuit parts is provided. The present invention as well as the set of problems underlying it will be explained below with reference to a diagnostic circuit inside a control device of a motor vehicle, without however thereby restricting the invention.

Diagnostic circuits are designed so as to detect and, if necessary, evaluate the status of a circuit or a part thereof so that faults can be identified early on. The diagnosis can be embodied in a more or less complex fashion. It is often sufficient to obtain an item of information concerning whether the circuit to be diagnosed has a fault or not. However, for many applications this simple type of diagnosis is not sufficient. For example, a faulty circuit arrangement can still be functional. Conversely, several different faults can occur which are to be valuated differently for the functioning of the circuit arrangement. One may also like to know, for the purpose of fault clearance in particular, what kind of fault one is dealing with, in order to take the appropriate measures to fix it. In the case of an antenna circuit to be diagnosed there are e.g. the following statuses:

a) Antenna is functional;
b) Supply line(s) is/are functional;
c) Short-circuit of the antenna against a supply potential;
d) Short-circuit of a supply line against a supply potential;
e) Short-circuit of the antenna coil;
f) Antenna not plugged in.

The simple diagnosis merely differentiates case (a) from the other cases (b)-(f). A differentiation of fault cases (b)-(f) is not possible here however. To this end, an extended diagnostic circuit with a diagnosis function which is extended in comparison to the simple diagnosis is required, which is set up so as to differentiate the various fault cases (b)-(f) from each other. However, this means that according to the type and desired functionality of the diagnosis, corresponding diagnostic circuits must be produced. However, as regards manufacturing technology this is relatively complex, as the diagnostic circuits which each differ in their function respectively can only be manufactured in a comparatively small quantity, which then leads overall to higher costs for the individual diagnostic circuits.

For this reason there is the need to produce a single diagnostic circuit which is designed both for full functionality and for a restricted functionality. This can be realized for instance by suppressing a part of the functionality of the diagnostic circuit, for example by the corresponding semiconductor chip being programmed during production by the use of so-called fuses and antifuses, and in this way determining already during the production whether the diagnostic circuit has the full functionality or the reduced functionality. This is relatively complex in terms of manufacturing technology. Moreover, this procedure does not guarantee the required flexibility, as it has to be determined already very early on in the production process, e.g. by the semi-conductor manufacturer, whether the diagnostic circuit now has the full or the reduced functionality. This can also not be changed later. There is however frequently the need for the manufacturer of the control devices with the diagnostic circuits attached thereto to wish to carry out a corresponding determination as to whether these diagnostic circuits have the full or the reduced functionality.

A further possible solution would consist in adjusting the complete or the reduced functionality of the diagnostic circuit by switching over an external switch attached to the diagnostic circuit. The problem here however consists in the manufacturer of control devices with diagnostic circuits wishing to have the possibility on the one hand of offering and marketing a comparatively expensive diagnosis with full functionality, or on the other hand a more cost-effective diagnostic circuit with reduced functionality by comparison therewith. In the case of an external switchability of the functionality, this would be disadvantageous in that in a more cost-effective diagnostic circuit with a reduced functionality, the user can switch over to the complete functionality of the diagnostic circuit after sale, even though he/she has not paid for said complete functionality.

BRIEF SUMMARY OF THE INVENTION

Against this background, the object underlying the present invention is to provide a circuit arrangement with switchable functionality, which is very simple from the point of view of manufacturing technology and which in particular enables a simple identification of the desired functionality.

This object is achieved in accordance with the invention by means of a circuit arrangement with the features of claim 1 and/or by an electronic component with the features of claim 10.

Provision is made accordingly for:

A circuit arrangement with switchable functionality, with a first integrated circuit which has complete functionality in a first operating mode, and has reduced functionality compared with the complete functionality in at least one further operating mode, with an output terminal onto which a coupling element can be coupled, with an identification device which identifies when a first supply potential is applied to the output terminal via the coupling element and in this case generates a status signal with a first value and which otherwise generates a status signal with second value, with an adjusting device which adjusts the complete or reduced functionality depending on the value of the status signal in the case of the first integrated circuit.

An electronic component with a carrier element on which are arranged at least one circuit arrangement according to one of the previous claims and at least one contact surface set at a distance from the circuit arrangement, with one at least partly closed housing, within which the carrier element is arranged, wherein in the first operating mode the output terminal is connected with the contact surface via the coupling element, and in the second operating mode the output terminal is completely disconnected and separated from the contact surface.

The idea of the present invention consists in that in a circuit arrangement according to the invention, a complete functionality and on the other hand a reduced functionality of an integrated circuit, like e.g. a diagnostic circuit, can be adjusted in defined fashion as a result in that a coupling element is connected or not connected to an output terminal, for example a bond pad. This coupling element which is coupled to the output terminal or the bond pad is connected to a defined supply potential. Depending on whether the coupling element is coupled to the output terminal or the bond pad or not, a defined differing potential arises through this, a potential which can be identified by means of an identification device specially provided for this purpose. By attaching or not attaching a coupling element to the output terminal or the bond pad, a switch function can thus be realized to some extent, and in this case a distinction can be drawn in each case between the complete and the reduced functionality. By evaluation of the status identified in this way, the complete or reduced functionality can subsequently be adjusted with an adjusting device specially provided herefor.

In this way a single chip which has an integrated circuit with different functions can be produced in large quantities and hence in an extremely cost-effective manner. In the first variant, all properties of the integrated circuit are thereby available and in this way the manufacturer can set himself apart from competitors in terms of the costs and properties of corresponding products. With the reduced variants, a general, cost-effective commercialization with reduced properties can be realized.

The circuit arrangement according to the invention, which has the integrated circuit with complete and reduced functionality as well as the corresponding bond pad or the output terminal with the coupling element, is typically arranged in an electronic component specially provided herefor. By pouring, spraying etc. synthetic resin on the chip with the circuit arrangement according to the invention and the corresponding lead frame, an adverse modification of the circuit arrangement, for example by isolation of the special properties, is advantageously no longer possible without destruction of the housing and hence of the electronic component. In this way a high level of safety is also provided, as later such a coupling element can no longer be attached to the output terminal or the bond pad, or at least only with an extraordinarily large effort.

Advantageous embodiments and further developments of the invention emerge from the further subclaims and from the further synoptic description with the drawing.

A preferred embodiment provides for the first integrated circuit to have a diagnostic circuit for diagnosis of the status of circuit elements of a second integrated circuit within the circuit arrangement. Another function of the first integrated circuit would however also be conceivable, for example a test circuit, control circuit, regulating circuit, etc.

In a preferred embodiment, the diagnostic circuit is designed in complete functionality in order to carry out at least a 3-bit diagnosis. In reduced functionality, the diagnostic circuit is designed in order to carry out a 1-bit or 2-bit diagnosis.

In a preferred embodiment, the first integrated circuit has a switchover device for adjusting the functionality of the first integrated circuit.

The second integrated circuit has for instance a bridge circuit, in particular an H-bridge. The embodiment of the second integrated circuit as an antenna circuit, test circuit, control circuit or regulating circuit, etc. would also be conceivable however.

Particularly for reasons of reducing the space requirement, integration of the first and second integrated circuit, the adjusting device and/or the identification device in a single semiconductor chip is particularly advantageous. In this way the inventive circuit arrangement can be particularly cost-effectively manufactured.

In a preferred embodiment, the identification device has an impedance, which on the one hand is connected to a power input with a second supply potential and which on the other hand is connected to a tap between the bond pad and/or the output terminal and the adjusting device at which the status signal can be tapped. The impedance is preferably embodied as a resistive element, in particular as a resistor. A capacitive or inductive element would however also be conceivable as an impedance.

A further embodiment provides for an evaluation device which evaluates the status signal and which generates a control signal for adjusting the functionality of the first integrated circuit as a function of the value of the status signal.

In a preferred embodiment, the coupling element is designed as bond wire which is bonded to the bond pad. The embodiment of the coupling element as an external bridge or as a connecting metallization (mask connection) would also be conceivable, however, for example on the lead frame or the circuit board.

The invention is described in greater detail below on the basis of the exemplary embodiments specified in the schematic figures of the drawing, in which;

BRIEF DESCRIPTION OF THE SEVERAL VIEWS OF THE DRAWING

FIGS. 2A, 2B show block diagrams with sections of the inventive circuit arrangement from FIG. 1, in order to illustrate the adjustable functionality of an integrated circuit;

FIG. 3 shows a block diagram for an electronic component with an inventive circuit arrangement.

DESCRIPTION OF THE INVENTION

Figure 1:
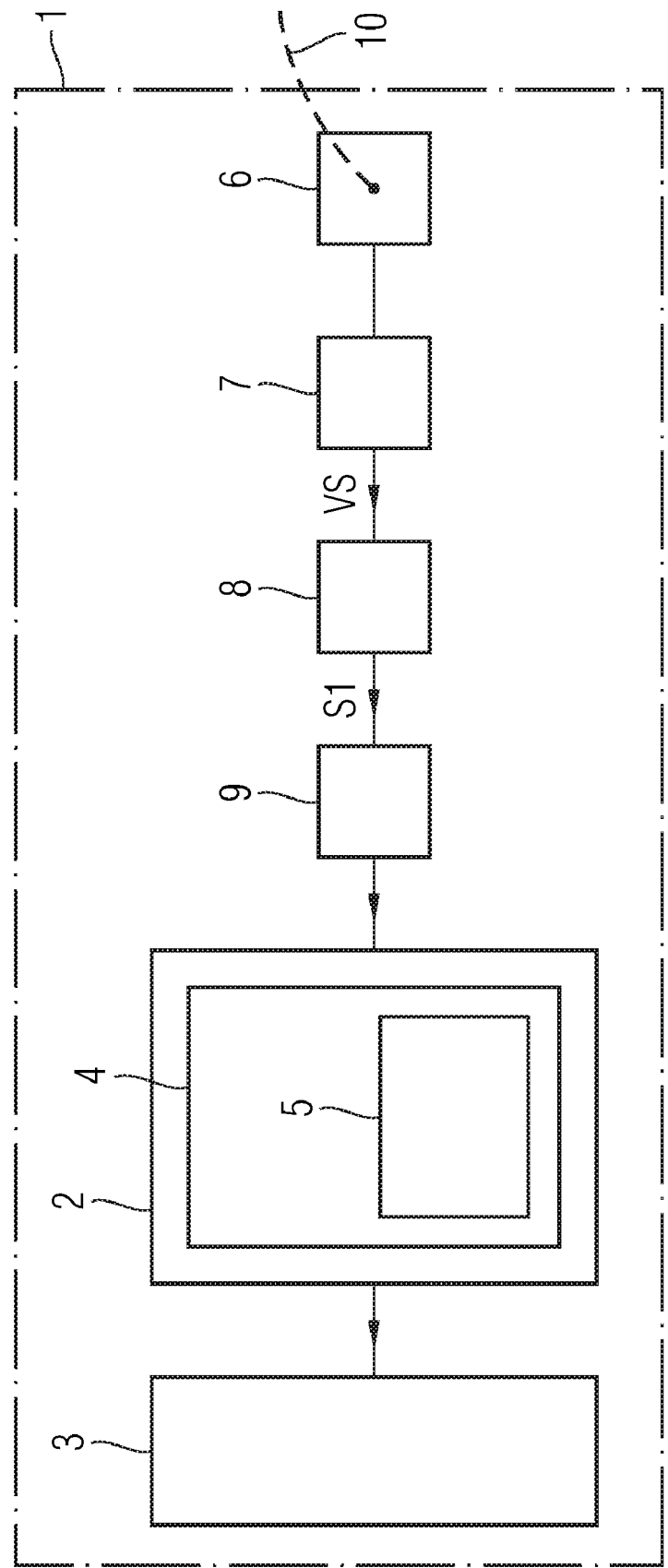
FIG. 1 shows a block diagram of an inventive circuit arrangement, with adjustable functionality.

In the figures of the drawings, the same and functionally identical elements and signals—unless otherwise implemented—are provided with the same reference characters.

FIG. 1 shows a circuit arrangement according to the invention with adjustable functionality, designated with reference character 1. The inventive circuit arrangement 1 has a first part 2 and a second part 3 of an integrated circuit. In the present exemplary embodiment it should be assumed that the first part 2 of the integrated circuit is a diagnostic circuit and the second part 3 of the integrated circuit is a circuit 3 to be diagnosed by the diagnostic circuit 2, for example a bridge circuit. The diagnostic circuit 2 in turn contains a first circuit part 4, which provides complete functionality for the diagnosis, and a second circuit part 5, which on the other hand has reduced functionality for the diagnosis. The circuit part 5 with reduced functionality is typically, but not necessarily, a component of the first circuit part 4 with complete diagnosis functionality.

To adjust the functionality of the diagnostic circuit 2, a bond pad 6, an identification device 7, the evaluation device 8 as well as an adjusting device 9 are provided in accordance with the invention. A coupling element 10 can be coupled to the bond pad 6, which typically represents a contactable contact surface. The coupling element 10 is only shown with a dashed line in FIG. 1. A potential can be applied on the bond pad 6 via this coupling element 10.

The identification device 7 is designed so as to identify whether or not a coupling element 10 is attached to the bond pad 6. Depending on this, the identification device 7 generates a status signal VS, which has a first signal level in the case of a coupled coupling element 10 and a second signal level in the case of a non-coupled coupling element 10. The status signal VS is subsequently conveyed to the evaluation device 8, which evaluates the signal level of the status signal VS and, depending on this, feeds a corresponding control signal S1 to the adjusting device 9. The adjusting device 9 is connected to the first integrated circuit. The adjusting device 9 is designed as a function of the control signal S1 so as to activate either the first circuit part 4 or the second circuit part 5. The adjusting device 9 can be designed as a switch for example.

The first integrated circuit 2 is designed in such a way as to diagnose the function of the second integrated circuit 3. Depending on which of the two circuit parts 4, 5 of the first integrated circuit 2 is activated, a complete diagnosis is carried out by means of the first circuit part 4 or a comparatively reduced diagnosis is carried out by means of the circuit part 5.

Even though the identification circuit 7, the evaluation circuit 8 and the adjustment circuit 9 were depicted as separate circuit blocks in FIG. 1, it is self-evident that these can also be components of the first integrated circuit 2. Moreover, all circuit parts 2, 3, 6, 7, 8, 9, or parts thereof can be integrated together in a single semiconductor chip, or can also be designed separately from each other.

The principle of adjustability is explained below by means of the inventive circuit arrangement 1 on the basis of the subsequent FIGS. 2A and 2B:

In FIGS. 2A and 2B, the identification device 7 has an impedance 13. It is assumed that the impedance 7 is embodied as a resistor 13. The resistor 13 is connected on the one hand to a first power input 14, to which a first supply potential VDD is applied, for example a positive supply potential VDD, and on the other hand to a tap 15 which is arranged between the bond pad 6 and the evaluation device 8.

In FIGS. 2A and 2B, a contact surface 11 set at a distance from the bond pad 6 is furthermore provided. The contact surface 11 is connected to a second power input 12 with a second supply potential GND, for example the potential of the ground potential GND.

In FIG. 2A, the bond pad 6 is connected via a coupling element 10, embodied as bond wire 10 for instance, to the contact surface 11. This coupling of the bond pad 6 and the contact surface 11 by the bond wire 10 causes the second supply potential GND to appear on the tap 15. In contrast to this, there is a lack of such a bond wire in the arrangement in FIG. 2B, so that in FIG. 2B the bond pad 2 is completely decoupled from the contact surface 11. This decoupling has the effect that a test potential VM dependent on the resistance value arises on the tap 15 determined by the pull-up resistor 13. As the status signal VS in FIG. 2A has a different value (VS=GND), like the status signal VS=VM in FIG. 2B, it is possible to conclude whether or not the bond pad 6 is connected via a bond wire 10 to the contact surface 11 on the basis of the different values of the status signal VS. The corresponding evaluation is carried out in the evaluation device 8, which determines the value of the status signal VS. A simple comparator or even any comparing element can be provided as evaluation device 8 for instance. Depending on the comparison, the evaluation device 8 generates the control signal S1, which is a measure of the value of the status signal VS and which can thus be consulted for the control of the adjusting device 9.

FIG. 3 shows a schematic representation of an electronic component 20 with a circuit arrangement 1 according to the invention, as can be depicted in FIG. 1. The component 20 has housing 21 with a plurality of connection pins 22 led out from out of the housing 21. The connection pins 22 serve to electrically contact a carrier element arranged inside the housing 21, for example a circuit board or a lead frame. A semiconductor chip 24 as well as the contact surface 11 is attached to the circuit board 23, wherein the contact surface 11 is set at a distance from the semiconductor chip 24. In the present exemplary embodiment the semiconductor chip 24 contains an integrated circuit 25, which has the circuit elements 2 to 5 and 7 to 9 of the circuit arrangement in integrated form. Furthermore, a bond pad 6 is attached to the semiconductor chip 24, said bond pad being connected via the bond wire 10 to the contact surface 11.

Although the present invention was described above on the basis of a preferred exemplary embodiment, it is not restricted to this, but can instead be modified in various different ways.

The invention is thus not particularly restricted to an integrated circuit embodied as a diagnostic circuit, but can instead be extended to other circuits. Moreover, the second circuit part does not necessarily have to be embodied as a bridge circuit, but can also be embodied as an antenna circuit, a control circuit or suchlike. The function of the identification device, evaluation device and adjusting device can also be designed in an arbitrarily different fashion by a microcontroller for instance.

Instead of the embodiment of the identification device as pull-up resistor, a pull-down resistor would of course also be conceivable. In this case, only the algebraic sign of the supply potential would have to be reversed, which means that a negative potential or the reference potential would apply to the pull-down resistance and a positive potential would apply to the contact surface.

The invention claimed is:

1. A circuit arrangement with switchable functionality, comprising:
    a first integrated circuit having full functionality in a first operating mode and having reduced functionality, relative to the full functionality, in at least one further operating mode;
    an output terminal for coupling a coupling element;
    an identification device configured to identify when said output terminal has a first supply potential applied thereto via said coupling element, and to generate a status signal in that case with a first value, and configured to generate a status signal with a second value when the output signal is separated from the first supply potential; and
    an adjusting device configured to set said first integrated circuit to the full functionality or the reduced functionality solely in dependence on a value of the status signal.

2. The circuit arrangement according to claim 1, wherein said first integrated circuit has a diagnostic circuit for diagnosing a status of circuit elements of a second integrated circuit inside the circuit arrangement.

3. The circuit arrangement according to claim 2, wherein in full functionality said diagnostic circuit is configured to carry out at least a 3 bit diagnosis, and said diagnostic circuit is configured to carry out a maximum 2 bit diagnosis in reduced functionality.

4. The circuit arrangement according to claim 1, wherein said first integrated circuit has a switchover device for adjusting the functionality of said first integrated circuit.

5. The circuit arrangement according to claim 2, wherein the second integrated circuit has a bridge circuit.

6. The circuit arrangement according to claim 5, wherein said bridge circuit is an H-bridge.

7. The circuit arrangement according to claim 2, wherein said first integrated circuit, said second integrated circuit, said adjusting device, and said identification device are integrated in a single semiconductor chip.

8. The circuit arrangement according to claim 1, wherein said identification device includes an impedance having a first terminal connected to a power input with a second supply potential and a second terminal connected to a tap between said output terminal and said adjusting device, and wherein said tap carries said status signal.

9. The circuit arrangement according to claim 8, wherein said impedance is a resistive element.

10. The circuit arrangement according to claim 8, wherein said impedance is a resistor.

11. The circuit arrangement according to claim 1, which comprises an evaluation device for evaluating the status signal and for generating a control signal for adjustment of the functionality of said first integrated circuit in dependence on a value of the status signal.

12. An electronic component, comprising:
   a carrier element;
   at least one circuit arrangement according to claim 1 disposed on said carrier element and at least one contact surface disposed on said carrier element at a spacing distance from said circuit arrangement;
   a housing at least partially enclosing said carrier element;
   wherein the output terminal is connected to the contact surface via the coupling element in the first operating mode and the output terminal is completely separated from the contact surface in the second operating mode.

13. The electronic component according to claim 12, wherein said coupling element is a bond wire, an external bridge, or a connecting metallization.

14. The electronic component according to claim 12, which comprises a plurality of external connection pins protruding out of said housing and each connected to a corresponding contact pad on said carrier element via bond wires, wherein one of said connection pins is connected to the contact surface and is available for application of the first supply potential.

* * * * *